United States Patent
Reid et al.

(10) Patent No.: US 8,530,247 B2
(45) Date of Patent: Sep. 10, 2013

(54) CONTROL OF IMPLANT PATTERN CRITICAL DIMENSIONS USING STI STEP HEIGHT OFFSET

(75) Inventors: Brian Douglas Reid, Plano, TX (US); James David Bernstein, Plano, TX (US); Hongyu Yue, Plano, TX (US); Howie Hui Yang, Carrollton, TX (US); Mark Boehm, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 222 days.

(21) Appl. No.: 12/323,025

(22) Filed: Nov. 25, 2008

(65) Prior Publication Data
US 2009/0170222 A1    Jul. 2, 2009

Related U.S. Application Data

(60) Provisional application No. 61/017,442, filed on Dec. 28, 2007.

(51) Int. Cl.
*H01L 21/027* (2006.01)
*H01L 21/66* (2006.01)

(52) U.S. Cl.
USPC ............. 438/5; 257/E21.027; 257/E21.53

(58) Field of Classification Search
USPC ............. 257/E21.023, E21.027–E21.029, 257/E21.038, E21.039, E21.528, E21.53; 438/5, 7, 14
See application file for complete search history.

(56) References Cited

U.S. PATENT DOCUMENTS

| 6,387,764 | B1 | 5/2002 | Curtis et al. |
| 6,587,744 | B1 | 7/2003 | Stoddard et al. |
| 6,643,596 | B2 | 11/2003 | Firth et al. |
| 6,645,851 | B1 * | 11/2003 | Ho et al. ............ 438/626 |
| 2006/0175678 | A1 * | 8/2006 | Mitros et al. ............ 257/492 |
| 2007/0020777 | A1 * | 1/2007 | Tso et al. ............ 438/14 |

* cited by examiner

*Primary Examiner* — Fernando L Toledo
*Assistant Examiner* — Daniel Shook
(74) *Attorney, Agent, or Firm* — Warren L. Franz; Wade J. Brady, III; Frederick J. Telecky, Jr.

(57) ABSTRACT

A method for semiconductor processing is provided, wherein a semiconductor wafer having undergone polishing is provided. The semiconductor wafer has an active region positioned between one or more moat regions, wherein the one or more moat regions have an oxide disposed therein. A top surface of the active region is recessed from a top surface of the moat region, therein defining a step having a step height associated therewith. A step height is measured, and a photoresist is formed over the semiconductor wafer. A modeled step height is further determined, wherein the modeled step height is based on the measured step height and a desired critical dimension of the photoresist. A dosage of energy is determined for patterning the photoresist, wherein the determination of the dosage of energy is based, at least in part, on the modeled step height. The photoresist is then patterned using the determined dosage of energy.

20 Claims, 2 Drawing Sheets

US 8,530,247 B2

CONTROL OF IMPLANT PATTERN CRITICAL DIMENSIONS USING STI STEP HEIGHT OFFSET

REFERENCE TO RELATED APPLICATION

This application claims priority to and the benefit of U.S. Provisional Application Ser. No. 61/017,442 which was filed Dec. 28, 2007, entitled "Improved Control of Implant Critical Dimensions Using an STI Step Height Based Dose Offset", the entirety of which is hereby incorporated by reference as if fully set forth herein.

FIELD OF THE INVENTION

The present invention relates generally to semiconductor processing, and more particularly to an improved method for processing photoresist patterns in the presence of STI layers on a substrate.

BACKGROUND OF THE INVENTION

Semiconductor processing often involves the formation of components having varying voltage inputs in neighboring regions of a semiconductor wafer. For example, high-voltage components (e.g., transistors such as DMOS having voltages/currents up to 100V/2A) are formed in one region of the wafer, while lower-voltage components (e.g., CMOS and flash components) are formed in a neighboring region. In order to provide electrical isolation between one circuit and another on the wafer, semiconductor processing typically starts at moat formation, or shallow trench isolation (STI).

Initially, a surface of the wafer is substantially flat, wherein the wafer is typically coated with a nitride layer. An STI pattern is transferred to the nitride in the photolithography process, and the STI pattern is transferred into the silicon via an etch process, wherein trenches are formed in the silicon. The trenches are then filled with an oxide for electrical insulation (also called a "moat"). The oxide, however, not only fills the trenches, but also creates a layer of oxide over the entire surface of the wafer.

The wafer subsequently undergoes a polishing process, where the surface of the wafer is polished down to the nitride layer, wherein the nitride layer generally acts as a stopping layer for the polish process. Subsequently, the remaining nitride layer is then chemically removed. The CMP process, however, has a degree of selectivity associated therewith, wherein differing materials are polished at differing rates. For example, the rate at which the nitride layer is polished is slightly different than the rate at which the oxide is polished. Thus, while a planar surface is typically desired after the polishing, in reality, the surface not planar, but rather, a small step or ledge at the interface (or edge) between the moat (e.g., oxide) and active regions of the wafer is typically present.

After CMP processing, ion implantation processes are performed in order to form various doped regions in the active regions of the wafer. In order to implant ions into the respective active regions, photoresist layers are patterned over the wafer, wherein the photoresist generally prevents the ions from being implanted into non-selected regions. However, after implantation, achieved implant dosages and critical dimensions (CDs) associated with the photoresist have been found to vary significantly. In the past, such variations have been considered to be a matter or unknown "noise" in the process, and attempts have been made to control the variations by feedback systems that account for variations in photolithography tools, reticles, and combinations thereof for particular implant processes. However, variations in implant CDs can have deleterious results on device isolation parametrics, device performance, and production yields, especially as newer technology continuously moves to smaller and smaller device sizes.

In other semiconductor processing, BARC (bottom antireflective coating) layers are provided, wherein the BARC layers diminish CD variation. However, for ion implantation BARC layers cannot be utilized, since the BARC layer covers the whole wafer, and prevents the ion implantation implant from going through. Thus, an improved method for improving implant photoresist patterning CDs is desirable.

SUMMARY OF THE INVENTION

The present invention addresses the need for improved CD control in semiconductor processing, especially in regard to patterning masks for ion implantation processes. The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward a method for semiconductor processing. The method comprises providing a semiconductor wafer that underwent polishing. The semiconductor wafer comprises an active region positioned between one or more moat regions. The one or more moat regions comprise an oxide. A top surface of the active region is recessed from a top surface of the moat region. A step is defined by a step height. The step height is determined. A photoresist is formed over the semiconductor wafer. The method further comprises determining a modeled step height. The modeled step height is based on the measure step height and a desired critical dimension associated with the photoresist. A dosage of energy to pattern the photoresist is determined. The determination is based at least in part on the modeled step height. Finally the photoresist is patterned with the determined dosage of energy.

Another embodiment of the present invention is a method for improving critical dimensions of an ion implant photomask pattern. The method comprises providing a semiconductor wafer. The semiconductor wafer comprises one or more active regions and one or more STI regions. The one or more STI regions comprise an oxide. A first plane of the one or more active regions is recessed from a second plane of the one or more STI regions by a step height. The method further comprises measuring the step height. A photoresist layer is formed over the semiconductor wafer. A modeled step height offset is determined. The modeled step height offset determination is based on the measured step height and a predetermined relationship between variation in step height and variation in a desired photomask pattern critical dimension. The dosage of energy to pattern the photoresist with the desired critical dimension is determined. The determination is based, at least in part, on the modeled step height offset. Finally, the photoresist is patterned with the determined dosage of energy.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be

DETAILED DESCRIPTION OF THE INVENTION

Figure 1:
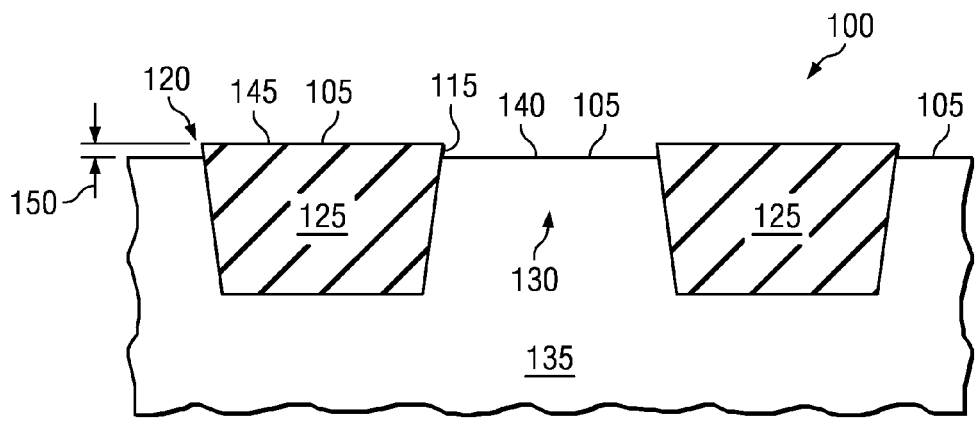
FIGS. 1-2 illustrate several STI regions of semiconductor workpiece having undergoing lithographic processing for ion implantation according to one aspect of the invention.

The present invention is generally directed towards a method for improving critical dimensions during semiconductor processing of a workpiece. In particular, the present invention provides a method for compensating for step heights in shallow trench isolation regions of a workpiece during an ion implantation. Accordingly, the present invention will now be described with reference to the drawings, wherein like reference numerals are used to refer to like elements throughout. It should be understood that the description of these aspects is merely illustrative and should not be taken in a limiting sense. In the following description, for purposes of explanation, numerous specific details are set forth in order to provide a thorough understanding of the present invention. It will be evident to one skilled in the art, however, that the present invention may be practiced without these specific details.

As device sizes in the semiconductor technology continue to decrease, ion implantation critical dimensions (CDs) are becoming more and more important to successful semiconductor processing. In general, what were typically believed to be non-critical regions or processes such as ion implantations into gate regions and moat formations in a semiconductor substrate, are increasingly being categorized as critical regions and/or processes. Generally, non-critical means that a greater degree of variation can be tolerated without affecting device performance, while critical regions or processes require a greater degree of control of CDs. The present invention appreciates several issues related to these formerly-considered non-critical regions, and provides several inventive solutions to improving CDs during processes such as ion implantation into active device regions.

In accordance with the invention, as an overview, the wafer (e.g., a silicon substrate) is initially flat, wherein a surface of the wafer is substantially planar. A nitride layer is formed over the wafer, wherein the nitride layer ultimately becomes a sacrificial layer for future processing. A shallow trench isolation (STI) pattern is transferred to the nitride layer in the photolithography process, and then the STI pattern is transferred into the silicon via an etch process. The etch process generally defines trenches in the silicon substrate, wherein the trenches are subsequently filled with an oxide (e.g., silicon oxide) for electrical insulation between various devices formed over active silicon regions between the trenches. The oxide that fills the trenches is commonly referred to as a "moat". However, the oxide not only fills the trenches, but also creates a layer of oxide over the entire surface of the wafer.

Thus, the wafer subsequently undergoes a polishing or CMP (Chemical Mechanical Polish) process, where the surface of the wafer is polished down to the nitride layer, and wherein the nitride layer generally acts as a stopping layer for the polishing process. The remaining nitride layer that is not removed by the CMP process is then chemically removed. Thus, the resultant wafer has active silicon regions that are electrically isolated from one another by moats of oxide.

CMP processing, however, has a degree of selectivity associated therewith, wherein differing materials are polished at differing rates. For example, the rate at which the nitride layer is polished is slightly different than the rate at which the oxide is polished. Thus, referring to FIG. 1, while it is desired for a surface 105 of the wafer 100 to be planar after the polishing, in reality the surface is not planar but typically has present a small step or ledge 115 at an interface 120 (or edge) between the moat 125 (e.g., oxide) and active region 130 of the silicon 135. This is due, at least in part, to the variability in polish rates between the nitride (not shown) and the oxide (shown in the moat 125). The degree of difference in height between a top surface 140 of the silicon 135 and a top surface 145 of the moat 125 is thus commonly referred to as a step height 150.

Figure 2:
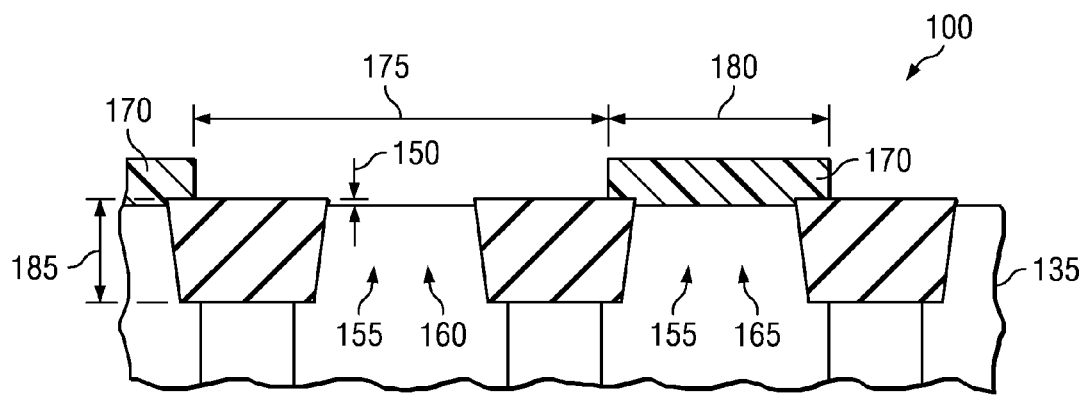

After CMP processing, several ion implantation processes are performed in order to form various doped or regions 155 (also called gate regions) in the silicon 135, as illustrated in FIG. 2. For example, an N-well region 160 and a P-well region 165 are implanted with N-type ions and P-type ions, respectively, for forming appropriate gate regions 155 for eventual transistor devices (not shown). In order to implant ions into the respective gate regions 155, a photoresist layer 170 is patterned over the wafer 100, wherein the photoresist layer generally prevents the ions from being implanted into non-selected gate regions 155 (e.g., P-well region 165). The ion implantation pattern (e.g., a VTP voltage threshold implant pattern for implanting P-type dopant) has several critical dimensions (CDs) associated therewith, such as a photoresist pattern space CD 175 and a photoresist pattern line CD 180 associated with the illustrated patterned photoresist layer 170, wherein the space CD and the line CD generally define the ion implantation boundaries. It is noted that CDs described in this invention, for example, define horizontal CDs, or CDs across the surface 105 of the wafer 100.

The inventors have discovered that, after ion implantation, achieved implant dosages associated with CDs 175 and 180 of the photoresist layer 170 have been found to vary significantly. In one inventive aspect, the inventors appreciate that patterned photoresist layer 170 (which can vary depending on the desired implant and are referred to in the industry as VTP, VTN, NLDD, NLDD2, etc., photoresist layers) have an unexpectedly strong sensitivity to the step height 150, wherein the step height contributes to the CD response. The step height 150 can be more generally defined by reference to the oxide thickness 185 (also called the field oxide thickness). The inventors have determined that, when patterning a thin layer (such as the oxide layer 125, nitride layer (not shown) or photoresist layer 170), the thickness of the underlying layer (e.g., the silicon 135, oxide layer, etc.) produces a sinusoidal or "swing" curve 200 in implant CDs illustrated in graph 205 of FIG. 3 (e.g., CDs 175 and 180 of FIG. 2 achieved with photoresist patterning) when keeping a dosage of the implant fixed. The graph 205 illustrates approximately one period of the sinusoidal curve 200 (also called a swing curve), wherein the swing curve illustrates the dependence of VTP patterned photoresist layer CDs on step height, which is associated with reflectivity of the associated surfaces. For example, physical properties (refraction, reflection, etc.) may differ based on the step height, since the step height is associated with the thickness 185 of the oxide.

In the past, this variation was unknown and was not compensated for in a productive way, thus leading to CDs that were out of control. Typical methods for attempting to control the CDs were by adjusting a dose of energy applied during patterning. The dose of energy, for example, varies based on the desired patterning process (e.g., UV light for DPV, or 193 nm light, 248 nm light, or 365 nm, etc.) and is controlled with an "adaptive controller". The adaptive controller has predetermined inputs (e.g., the particular tool used for the process, the particular reticle used to define the pattern, and an interaction term associated with both the tool and the reticle), wherein the predetermined inputs generally define the dose for a particular process "run" or "lot" of workpieces. The magnitude of each of those inputs is determined via an Exponentially Weighted Moving Average (EWMA) that uses past history for making a prediction about the dose needed to process the next lot of workpieces. For example, if a first tool needs to use more energy than a second tool in order to achieve the same result, the adaptive controller can account for this by adjusting the energy of the first tool. Likewise, long term drift, wherein a tool steadily degrades over time, can be compensated for via the adaptive controller.

Figure 3:
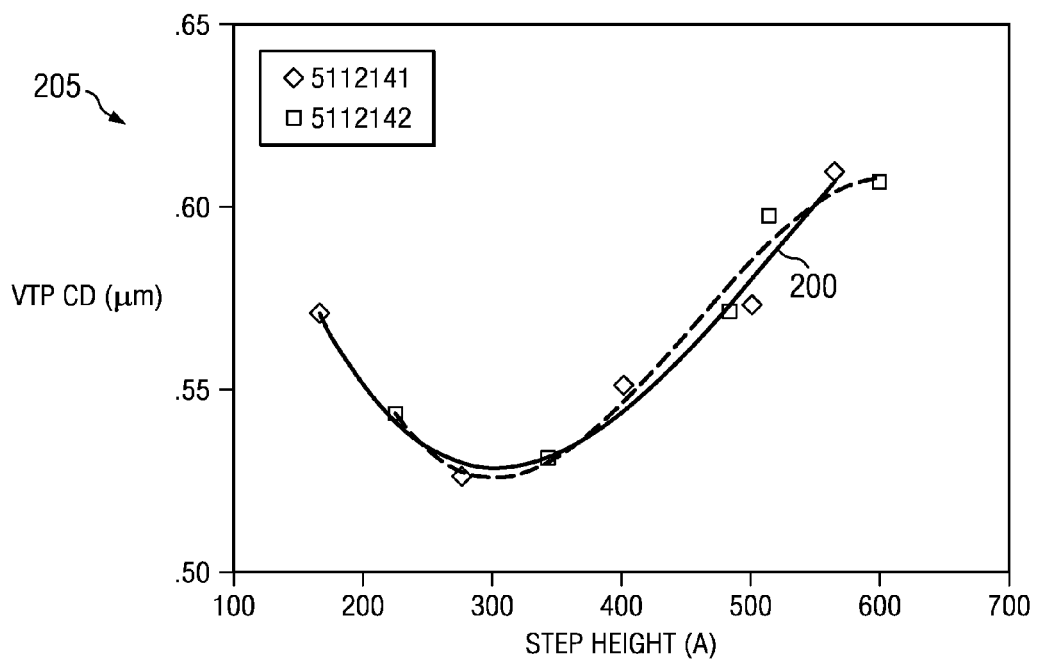
FIG. 3 illustrates a swing curve graph according to another aspect of the invention.

The present invention addresses the above-identified CD discrepancies by utilizing the adaptive controller in a novel way, wherein an additional input is applied in order to compensate for step height. For example, a well-defined function of CD versus step height can be attained by measuring both CD and step height (or, alternatively, oxide thickness described above) variations, and plotting them as illustrated in FIG. 3. Thus, an offset term can be defined for the controller to compensate for varying step heights.

In the past, the control of the CDs was based on the predetermined inputs or offsets by the following formula:

$$CD = dose + b_{tool} + b_{reticle} + b_{tool,eticle} \quad (1)$$

where the $b_{tool}$ is the tool offset, $b_{reticle}$ is reticle offset, and $b_{tool,eticle}$ is an interaction term for the tool and reticle. These predetermined inputs or offsets are tuned via the EWMA, and are controlled through the adaptive control software.

The present invention provides another term to be used in controlling CDs, called $b_{step\ height}$, as follows:

$$CD = dose + b_{tool} + b_{reticle} + b_{tool,reticle} + b_{step\ height} \quad (2)$$

wherein the step height offset $b_{step\ height}$ is a modeled, feed-forward offset that is based, at least in part, on the swing curve 200 of FIG. 3. For example, the step height 150 of FIGS. 1 and 2 is already measured in previous processing steps, and according to the present invention, the measured step height is utilized to correlate implant CD (e.g., VTP space CD 175) and step height (e.g., using the swing curve data 200), and the result is fed back into the adaptive controller. The field oxide thickness 185 of FIG. 2, for example, is measured in a conventional process control step in a previous operation (e.g., in the scribe area (not shown) of the wafer 110), and, as stated above, the oxide thickness 185 is directly associated with step height 150.

Figure 4:
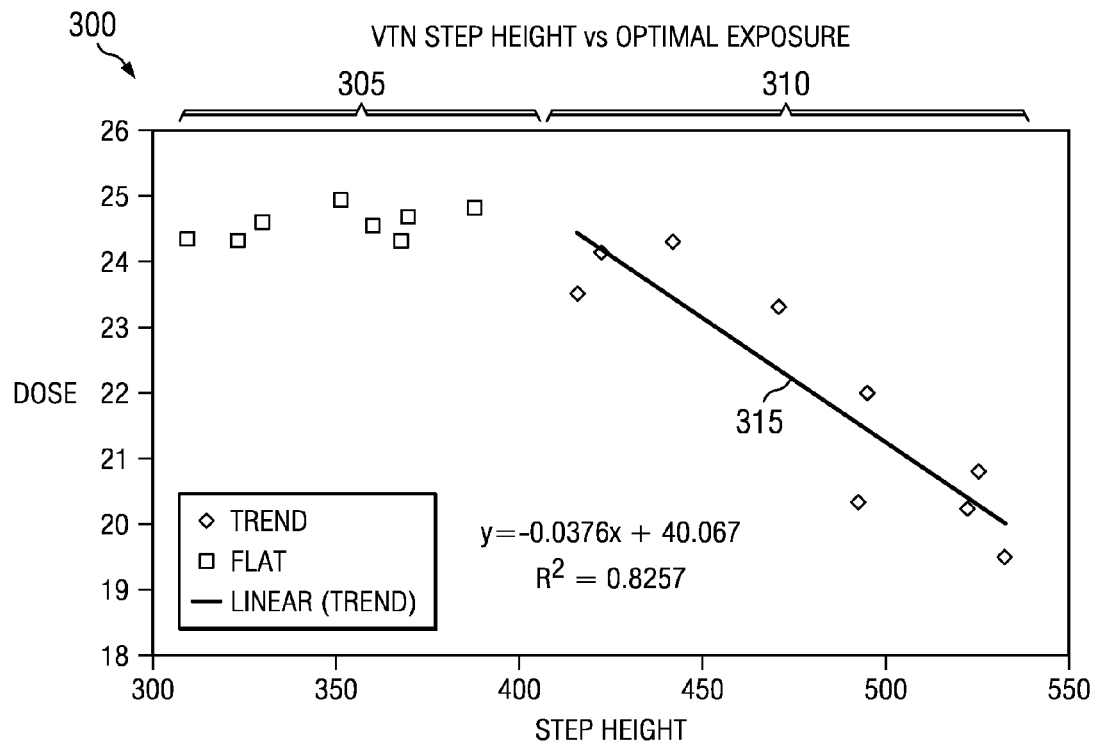
FIG. 4 illustrates a dosage versus step height graph in accordance with yet another aspect of the invention.

According to an alternative example, for simplification, instead of modeling the step height offset $b_{step\ height}$ strictly based on the swing curve 200 of FIG. 3, the step height offset $b_{step\ height}$ is measured for various dosages and is separated into two regions, as illustrated in graph 300 of FIG. 4. In a first region 305, for example, no step height offset $b_{step\ height}$ is input into equation (2), since the step height is generally not affected by dose. However, in a second region 310 a correction based on a formula for a sloped, curve-fit line 315 is determined, and the step height offset is determined based on the formula.

The modeled $b_{step\ height}$, for example, is applied on a per-lot basis. For instance, for a first lot of wafers, the step height 150 of FIGS. 1 and 2 is measured (e.g., after polishing or CMP), and the first lot of wafers are ready for a photolithography process. The measured step height is fed into the model (e.g., graph 205 of FIG. 3, or graph 300 of FIG. 4), wherein $b_{step\ height}$ is determined, and the first lot of wafers is processed in the photolithography process using the modeled step height offset. When a second lot of wafers is processed, the step height is measured in a similar manner, and the step height offset $b_{step\ height}$ for the second lot of wafers is adjusted prior to lithographic processing. Accordingly, the present invention utilizes a knowledge of the behavior CDs based on step height that is known prior to entering the photolithography process, wherein the model anticipates variations, and a linear offset is appropriately input to the controller in a feed-forward manner, as opposed to strictly feedback-based processing conventionally performed.

CDs are still measured after lithographic processing in the present invention, however, adjustment to the processing of the lot for the step height is made prior to measuring the CDs, wherein the adjustment (if any) is based, at least in part, on the measured step height from previous processing of the same wafers, and knowledge about the particular tool and reticle used. For example, CD measurements that are made after lithographic processing are further fed back to adjust the $b_{tool}$, $b_{reticle}$, and $b_{tool,reticle}$ terms.

The present invention accordingly provides a method for improving control of CDs associated with ion implantation. While example methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 5:
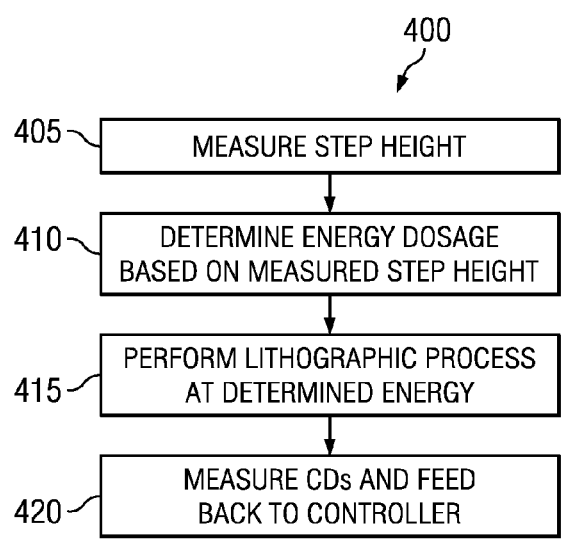
FIG. 5 illustrates a block diagram schematic of a method for processing a semiconductor workpiece in accordance with one example of the present invention.

As illustrated in FIG. 5, one example method 400 is illustrated, wherein the method begins with act 405 by measuring a step height prior to a photolithographic process. The photolithographic process, for example, is further associated with an ion implantation process, as described above. The step height measured in act 405, for example, may be measured after a CMP process, wherein the actual step height is measured. Alternatively, a thickness of the oxide layer, as described above may be measured, wherein the thickness of the oxide layer is directly related to the step height in a known manner.

In act 410, the step height is provided to a controller, wherein the controller utilizes the step height to determine a dosage of energy for exposure during the photoresist layer patterning process. For example, known tool, reticle, and interaction data for a lithographic tool are utilized by the controller, along with the input step height data, in order to determine the dosage that will provide a desired CD for the process. In accordance with the invention, the controller utilizes the measured step height to model a step height offset, as described above, wherein the step height offset provides the desired CDs for the process.

In act 415, the lithographic process is undertaken, using a dosage based, at least in part, on the modeled step height offset. In act 420, CDs that result from the lithographic process are measured, and the measured CDs are fed back into the controller for further control of the process.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated example embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method for fabricating a semiconductor device, comprising:
    providing a semiconductor substrate comprising an active region and one or more moat regions, wherein the one or more moat regions comprise an oxide disposed within one or more trenches, and wherein a step having a step height is defined between a top surface of the active region and a top surface of the one or more moat regions;
    measuring the step height;
    after measuring the step height, forming a photoresist layer over the semiconductor substrate;
    determining a modeled step height offset for a given photoresist pattern critical dimension for patterning of the photoresist layer as an ion implantation mask, wherein the modeled step height offset is determined from the measured step height and a predetermined relationship between variation in step height and variation in the given critical dimension;
    determining a dosage of energy to pattern the photoresist layer with the given critical dimension, wherein the determination is made using the modeled step height offset; and
    patterning the photoresist layer with the determined dosage of energy to form the ion implantation mask.

2. The method of claim 1, wherein measuring the step height comprises a measurement between the top surface of the active region and the top surface of the one or more moat regions.

3. The method of claim 1, wherein measuring the step height comprises a measurement of a thickness of oxide from a bottom surface of the one or more moat regions to the top surface of the one or more moat regions.

4. The method of claim 1, wherein determining the modeled step height offset comprises correlating the measured step height to the given critical dimension via a swing curve.

5. The method of claim 1, wherein determining the modeled step height offset comprises correlating the measured step height to the given critical dimension via a linear correlation for the measured step height being within a predetermined range.

6. The method of claim 1, further comprising implanting ions into the substrate using the ion implantation mask.

7. The method of claim 1, wherein the dosage of energy to pattern the photoresist layer is further determined using parameters of a lithographic tool and a reticle used to pattern the photoresist layer.

8. A method for fabricating a semiconductor device, comprising:
    providing a semiconductor substrate;
    forming trenches within the substrate;
    forming a layer of insulating material over the substrate, including within the trenches;
    performing chemical-mechanical polishing to planarize the layer of insulating material, thereby forming an active region and a shallow trench isolation region, wherein a step having a step height is defined between a top surface of the active region and a top surface of the shallow trench isolation region;
    measuring the step height;
    after measuring the step height, forming a photoresist layer over the semiconductor substrate;
    defining a modeled step height offset for a given photoresist pattern critical dimension for patterning of the photoresist layer as an ion implantation mask, wherein the modeled step height offset is determined from the measured step height and a predetermined relationship between variation in step height and variation in the given critical dimension;
    determining a dosage of energy to pattern the photoresist layer with the given critical dimension, wherein the determination is made using the modeled step height offset; and
    patterning the photoresist layer with the determined dosage of energy to form the ion implantation mask.

9. The method of claim 8, wherein the given critical dimension is a dimension of a space or line of an ion implantation pattern of the patterned photoresist layer.

10. The method of claim 8, wherein measuring the step height comprises a measurement between the top surface of the active region and the top surface of the shallow trench isolation region, prior to patterning the photoresist layer.

11. The method of claim 8, wherein measuring the step height comprises a measurement of the thickness of the insulating material from a bottom to the top of the shallow trench isolation region.

12. The method of claim 8, wherein determining the modeled step height offset comprises correlating the measured step height to the given critical dimension via a swing curve.

13. The method of claim 12, wherein the swing curve is determined empirically from a plurality of wafers having differing step heights.

14. The method of claim 8, wherein determining the modeled step height offset comprises correlating the measured step height to the given critical dimension via a linear correlation for the measured step height being within a predetermined range.

15. The method of claim 8, further comprising implanting ions into the wafer using the ion implantation mask.

16. The method of claim 8, wherein determining the dosage of energy to pattern the photoresist layer is further determined using parameters of a lithographic tool and a reticle used to pattern the photoresist layer.

17. The method of claim 8, further comprising forming a planarization stopper layer over the substrate; and wherein performing the chemical-mechanical polishing comprises planarizing the layer of insulating material down to the planarization stopper layer.

18. The method of claim 17, wherein the planarization stopper layer comprises a nitride material.

19. The method of claim 18, wherein the planarization stopper layer comprising the nitride material is formed prior to forming the trenches; and wherein remaining parts of the nitride material are removed chemically following the chemical-mechanical polishing.

20. The method of claim 8, wherein the semiconductor device includes a transistor; and the critical dimension is a dimension of a space or line of a threshold voltage (VT) ion implantation pattern of the patterned photoresist layer.

* * * * *